(12) United States Patent
Garcia-Osuna

(10) Patent No.: US 7,762,354 B2
(45) Date of Patent: Jul. 27, 2010

(54) PEIZOELECTRIC GENERATOR PARTICULARLY FOR USE WITH WELLBORE DRILLING EQUIPMENT

(75) Inventor: Fernando Garcia-Osuna, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 194 days.

(21) Appl. No.: 11/836,238

(22) Filed: Aug. 9, 2007

(65) Prior Publication Data

US 2009/0038848 A1 Feb. 12, 2009

(51) Int. Cl.
*E21B 47/12* (2006.01)

(52) U.S. Cl. .......................... 175/56; 310/339; 166/65.1

(58) Field of Classification Search ................. 166/65.1; 175/40, 56; 310/339
See application file for complete search history.

(56) References Cited

U.S. PATENT DOCUMENTS

| | | | | |
|---|---|---|---|---|
| 3,090,031 | A * | 5/1963 | Lord | 340/854.8 |
| 4,467,236 | A * | 8/1984 | Kolm et al. | 310/321 |
| 4,518,888 | A * | 5/1985 | Zabcik | 310/334 |
| 5,166,907 | A | 11/1992 | Newnham et al. | |
| 5,839,508 | A * | 11/1998 | Tubel et al. | 166/65.1 |
| 6,614,360 | B1 * | 9/2003 | Leggett et al. | 340/853.1 |
| 7,350,568 | B2 * | 4/2008 | Mandal et al. | 166/254.2 |
| 2005/0193823 | A1 * | 9/2005 | Amano | 73/704 |
| 2006/0016606 | A1 | 1/2006 | Tubel et al. | |
| 2006/0225926 | A1 | 10/2006 | Madhavan et al. | |
| 2007/0114890 | A1 | 5/2007 | Churchill | |
| 2008/0265712 | A1 * | 10/2008 | Ulm et al. | 310/313 B |

FOREIGN PATENT DOCUMENTS

WO  WO2007072479  6/2007

* cited by examiner

*Primary Examiner*—Shane Bomar
*Assistant Examiner*—Brad Harcourt
(74) *Attorney, Agent, or Firm*—David J. Smith; Dave R. Hofman

(57) ABSTRACT

An electric power generator includes a conduit disposed in a wellbore penetrating subsurface formations and at least one piezoelectric transducer in contact with the conduit. The piezoelectric transducer is configured to undergo stress in response to vibration in the conduit. The transducer includes a plurality of piezoelectric crystals stacked in a thickness direction and each polarized in the thickness direction. The transducer comprises at least one of a composite rubber layer disposed between successive piezoelectric crystals, and at least one support at a longitudinal end of the transducer configured to cause the crystals to bend in response to vibration in the conduit.

14 Claims, 5 Drawing Sheets

PEIZOELECTRIC GENERATOR PARTICULARLY FOR USE WITH WELLBORE DRILLING EQUIPMENT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The invention relates generally to the field of wellbore drilling systems and equipment. More specifically, the invention relates to electric power generators used with wellbore drilling equipment.

2. Background Art

Wellbore-deployed equipment includes various devices coupled in a conduit called a "drill string" suspended in a wellbore for the drilling of such wellbore. A drill string is a length of pipe generally assembled from segments ("joints") threadedly coupled end to end and having a drill bit at the lower end of the drill string. Drilling is performed by rotating and axially urging the drill bit to the bottom of the wellbore to extend the length of the wellbore.

The foregoing devices can include measurement while drilling ("MWD") and logging while drilling ("LWD") instruments. Such instruments are typically disposed inside one or more pipe segments called "drill collars" and are threadedly coupled within the drill string proximate the lower end thereof MWD instruments generally include sensors for determining the geodetic trajectory of the wellbore so that adjustments to the trajectory may be made during drilling. LWD instruments include various sensors for measuring one or more petrophysical characteristics of the Earth formations surrounding the wellbore, such that the wellbore operator may evaluate the presence of useful materials in the formations, such as petroleum. Some types of MWD and/or LWD instruments include a telemetry device that modulates flow of drilling fluid ("mud") through the drill string so that signals corresponding to certain of the measurements made by the various MWD and/or LWD instruments are communicated to the Earth's surface for decoding and interpretation while drilling operations are underway.

Irrespective of the types of sensors used in the MWD and/or LWD instruments with any particular drill string, it is necessary to supply electrical power to operate the sensors. Various devices used to supply electrical power for MWD and LWD instruments include batteries and turbine-operated electric generators. Each of the foregoing electrical power supplying devices is well known and widely used in MWD and LWD device operation.

Each of the foregoing electric power supplying devices has its own particular limitations. As a result, various devices have been conceived to attempt to use energy otherwise available in a wellbore to generate electrical power. U.S. Pat. No. 6,768,214 issued to Schultz et al. describes a power generator including a fluid conduit and a piezoelectric material attached to the conduit. When a pressure change takes place in the conduit, such as results from fluid flowing through the conduit, the piezoelectric material produces electricity due to flexing of the conduit. The conduit may include a reduced thickness portion, which has an increased degree of flexing in response to the fluid flow, with the piezoelectric material being attached to the reduced thickness portion.

U.S. Patent Application Publication No. 2006/0016606 filed by Tubel et al. describes a device, system, and methods of power generation in situ in a hydrocarbon producing well. A power generator for deployment in a hydrocarbon well tubular may comprise a housing adapted for deployment within a hydrocarbon well tubular; a mechanical to electrical power converter disposed at least partially within the housing, the mechanical to electrical power converter adapted to create an electric current when physically stressed; and a current converter operatively coupled to the mechanical to electrical power converter. Devices may be deployed downhole and operatively coupled to the power generator for their electrical power. Each of the foregoing devices uses energy in a flowing fluid in a hydrocarbon producing wellbore conduit to generate electrical power.

There continues to be a need for improved electrical power sources that can be used with wellbore drilling systems.

SUMMARY OF THE INVENTION

An electric power generator according to one aspect of the invention includes a conduit disposed in a wellbore penetrating subsurface formations and at least one piezoelectric transducer in contact with the conduit. The piezoelectric transducer is configured to undergo stress in response to vibration in the conduit. The transducer includes a plurality of piezoelectric crystals stacked in a thickness direction and each polarized in the thickness direction. The transducer comprises at least one of a composite rubber layer disposed between successive piezoelectric crystals, and at least one support at a longitudinal end of the transducer configured to cause the crystals to bend in response to vibration in the conduit.

A method for generating electrical power in a wellbore according to another aspect of the invention includes moving a conduit through the wellbore. Vibrations induced in the conduit are coupled to a piezoelectric transducer. The vibrations are induced by at least one of lateral vibration of the conduit, movement of fluid through the drill string, movement of fluid outside the conduit, and operation of a drill bit at a lower end of the conduit. The transducer includes a plurality of piezoelectric crystals stacked in a thickness direction and each polarized in the thickness direction. The transducer includes and at least one of a composite rubber layer disposed between successive piezoelectric crystals and at least one support at a longitudinal end of the transducer configured to cause the crystals to bend.

Other aspects and advantages of the invention will be apparent from the following description and the appended claims.

DETAILED DESCRIPTION

Figure 1:
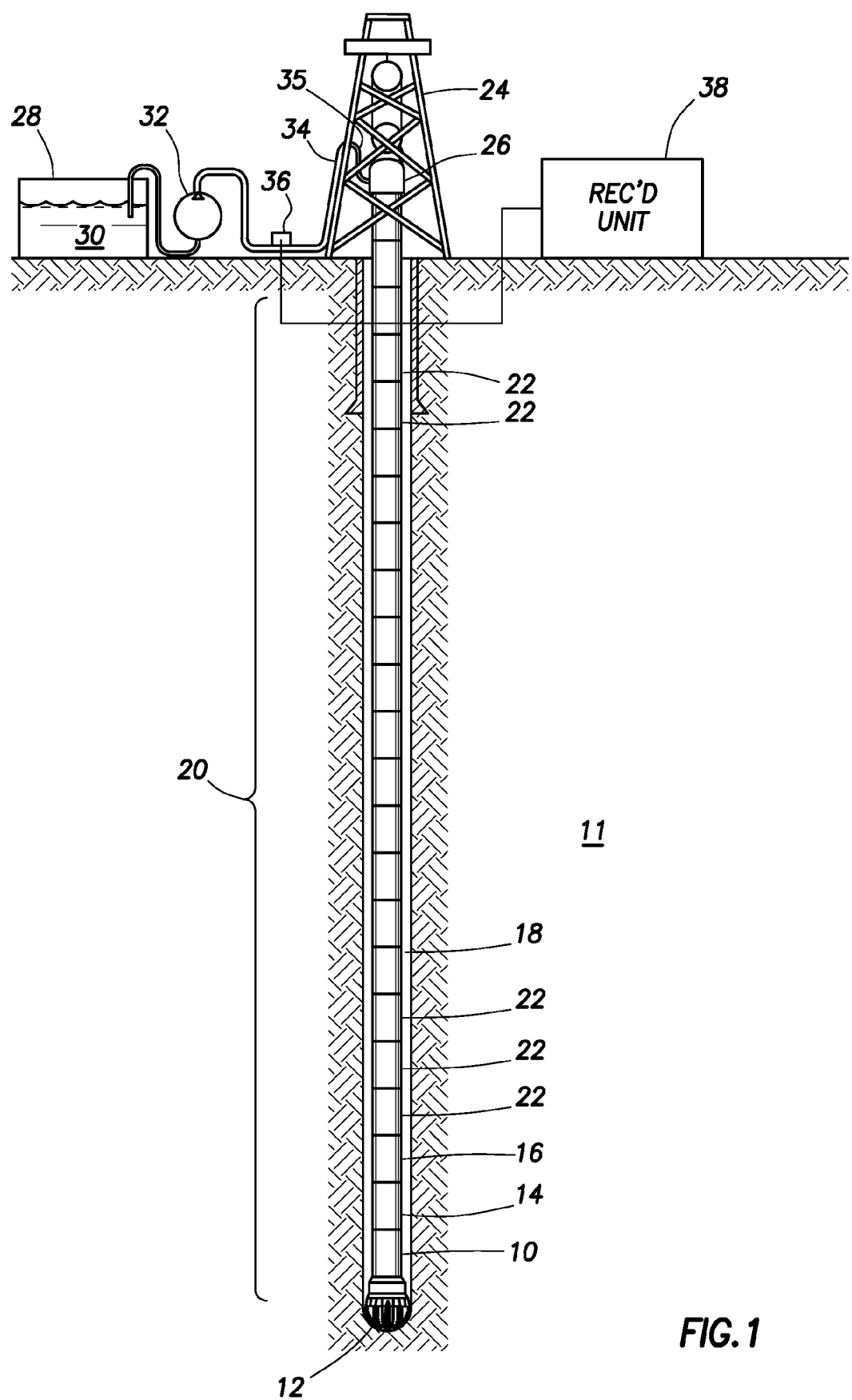
FIG. 1 shows an example drilling system with which the invention may be used.

An example wellbore instrumentation system with which various implementations of the invention may be used is shown schematically in FIG. 1. The present example is described in terms of drilling instrumentation, however it should be understood that certain aspects of the invention have application in any wellbore system through which fluid is moved. Therefore, the invention is not limited in scope to drilling instrumentation.

In FIG. 1, a drilling rig 24 or similar lifting device suspends a conduit called a "drill string 20" within a wellbore 18 being drilled through subsurface Earth formations 11. The drill string 20 may be assembled by threadedly coupling together end to end a number of segments ("joints") 22 of drill pipe. The drill string 20 may include a drill bit 12 at its lower end. When the drill bit 12 is axially urged into the formations 11 at the bottom of the wellbore 18 and when it is rotated by equipment (e.g., top drive 26) on the drilling rig 24, such urging and rotation causes the bit 12 to axially extend ("deepen") the wellbore 18. The lower end of the drill string 20 may include, at a selected position above and proximate to the drill bit 12, an electric generator sub 10 according to various aspects of the invention and which will be further explained below. Proximate its lower end of the drill string 20 may also include an MWD instrument 14 and an LWD instrument 16 of types well known in the art. At least art of the power to operate the MWD instrument 14 and LWD instrument 16 may be obtained from the generator sub 10.

During drilling of the wellbore 18, a pump 32 lifts drilling fluid ("mud") 30 from a tank 28 or pit and discharges the mud 30 under pressure through a standpipe 34 and flexible conduit 35 or hose, through the top drive 26 and into an interior passage (not shown separately in FIG. 1) inside the drill string 20. The mud 30 exits the drill string 20 through courses or nozzles (not shown separately) in the drill bit 12, where it then cools and lubricates the drill bit 12 and lifts drill cuttings generated by the drill bit 12 to the Earth's surface. Some examples of MWD instrument 14 or LWD instrument 16 may include a telemetry transmitter (not shown separately) that modulates the flow of the mud 30 through the drill string 20. Such modulation may cause pressure variations in the mud 30 that may be detected at the Earth's surface by a pressure transducer 36 coupled at a selected position between the outlet of the pump 32 and the top drive 26. Signals from the transducer 36, which may be electrical and/or optical signals, for example, may be conducted to a recording unit 38 for decoding and interpretation using techniques well known in the art. The decoded signals typically correspond to measurements made by one or more of the sensors (not shown) in the MWD instrument 14 and/or the LWD 16 instrument.

It will be appreciated by those skilled in the art that the top drive 26 may be substituted in other examples by a swivel, kelly, kelly bushing and rotary table (none shown in FIG. 1) for rotating the drill string 20 while providing a pressure sealed passage through the drill string 20 for the mud 30. Accordingly, the invention is not limited in scope to use with top drive drilling systems.

Figure 2:
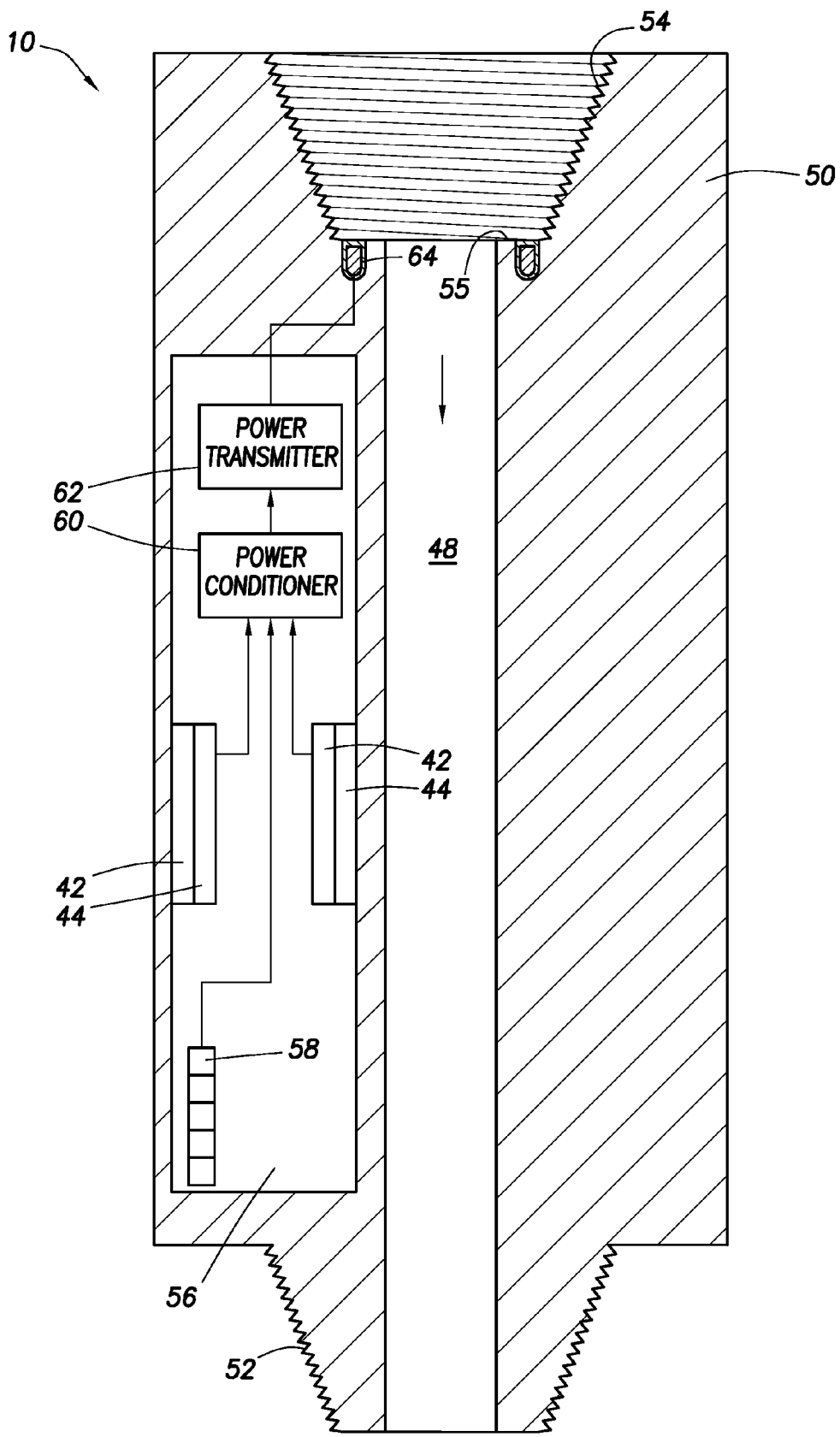
FIG. 2 shows a cross section of one example of a generator sub.

An example of the electric generator sub 10 is shown in cross section in FIG. 2. The electric generator sub 10 may be made using a selected length drill collar 50 or similar pipe segment configured to be threadedly coupled into the drill string (20 in FIG. 1). The drill collar may be made from non-magnetic allow such as monel, stainless steel or non-magnetic alloy sold under the trademark INCONEL, which is a registered trademark of Huntington Alloys Corporation, Huntington, W. Va. The drill collar 50 may include a male threaded connector or "pin" 52 at one longitudinal end and a female threaded connector or "box" 54 at the other longitudinal end. An internal thread shoulder 55 (shown in the box 54 in FIG. 2, but could also be in the pin 52) may include an electromagnetic coupling 64 for communicating electric power generated in the sub 10 to other components of the drill string (20 in FIG. 1), for example, the MWD and LWD instruments (see 14 and 16 in FIG. 1). Such electromagnetic couplings are described, for example, in U.S. Patent Application Publication No. 2006/0225926 filed by Madhavan et al., the patent application for which is assigned to the assignee of the present invention. A corresponding electromagnetic coupling (not shown in FIG. 2) may be included in a corresponding pin thread shoulder (not shown) of the instrument (not shown) coupled into the box 54. Alternatively, an insulated galvanic electrode or contact (not shown) may be disposed in the thread shoulder 55 for transmitting electrical power directly rather than by electromagnetic induction.

The collar 50 may define an interior chamber 56 in which may be contained some or all of the active components of the electric generator sub 10. The chamber 56 may be enclosed, sealed and maintained substantially at surface atmospheric pressure by inserting a resilient metal tube 61 into an interior passage 48 in the collar 50. The tube 61 may be sealed against the interior of the collar 50 by O-rings 63 or other sealing elements. The tube 61 should have sufficient strength to resist bursting by reason of the pressure of mud (30 in FIG. 1) therein during drilling, but should also be resilient enough to enable communication of pressure variations in the mud (30 in FIG. 1) to a piezoelectric transducer (explained below) coupled to the exterior thereof. Suitable materials for the tube 61 may include steel, or copper beryllium alloy, the latter preferred if the tube 61 needs to be non-magnetic.

In the present example, the chamber 56 may include therein one or more piezoelectric transducers, shown at 58 and 46. The one or more piezoelectric transducers 58, 46 are arranged to undergo stress (and consequently develop a voltage thereacross) as a result of certain types of vibrations induced in the drill string (20 in FIG. 1). One of the piezoelectric transducers, which may be referred to for convenience as a longitudinal transducer and which is shown at 58, may include a plurality of piezoelectric crystals stacked end to end, polarized in the direction of their thickness (along the longitudinal dimension of the drill collar 50 and see FIG. 3), and coupled at one end of the stack to a lowermost surface in the chamber 56. Arranged as shown in FIG. 2, the longitudinal transducer 58 may be responsive to axial vibrations generated during drilling as the drill bit (12 in FIG. 1) drills through the subsurface formations. Thus, the longitudinal transducer 58 may generate electric power from drill bit-induced or other axial vibrations induced in the drill string (20 in FIG. 1).

A second one of the piezoelectric transducers, shown at 46, may be made from a plurality of substantially planar piezoelectric crystals polarized in the direction of their thickness (as will be explained further below with reference to FIG. 3). The second transducer 46 may be coupled on one face to a metal protective shield 44, and the shield 44 placed in contact with an exterior surface of the tube 61 that is adjacent to the interior passage 48 for flow of drilling fluid (30 in FIG. 1). Arranged as shown in FIG. 2, the second transducer 46 may be responsive to vibrations in the drill string (20 in FIG. 1) caused by flow of the mud through the passage 48 in the collar 50. Vibrations induced in the collar 50 by the flow of mud (30 in FIG. 1) may thus result in electric power generation by the second transducer 46.

A third piezoelectric transducer 40 may be enclosed in elastomer 42 such as rubber to exclude fluid therefrom while enabling the transducer 40 to remain sensitive to pressure variations in the ambient environment. The third transducer 40 may be disposed in a recess 41 formed on the exterior of the collar 50. The third transducer 40 may be electrically coupled to circuits (explained below) in the chamber 56 using a pressure-sealed electrical feedthrough 65 of types well known in the art to exclude fluid from entering the chamber 56. Arranged as shown in FIG. 2, the third transducer 40 may generate electric power by reason of lateral vibrations induced in the drill string (20 in FIG. 1) and/or by reason of vibrations created by pressure variations in mud flowing in an annular space (FIG. 1) between the exterior of the drill string (20 in FIG. 1) and the wall of the wellbore.

In some examples, the piezoelectric materials used to make the transducers may be crystals or ceramics with high dielectric constants, high sensitivity, and high electro-mechanical constants. Examples of the foregoing include lead zirconate titanate (PZT) type ceramics with extremely high dielectric constant and high coupling coefficients, and piezoelectric single crystals lead magnesium niobate-lead titanate (PMN-PT) and lead zirconate niobate-lead titanate (PZN-PT), which both have extremely high charge constants, high electro-mechanical coupling coefficients and high dielectric constants.

The electrical output of each of the transducers 58, 46, 40 may be coupled to power conditioning circuits 60 disposed within the chamber 56. The power conditioning circuits 60 may include suitable switching, rectification and energy storage elements (e.g., capacitors, not shown separately) so that electric power generated by the transducers is stored and made available for other components of the drill string. A power transmitter 62 may be used to convert electric power stored in the storage elements (e.g., a capacitor bank—not shown) in the power conditioning circuits 60 to suitable alternating current for transmission using the electromagnetic coupling 64. The power transmitter 62 may be omitted if the electric power is communicated directly through a galvanic electrode (not shown). A particular example of the power conditioner will be explained in more detail below with reference to FIG. 6.

Figure 2A:
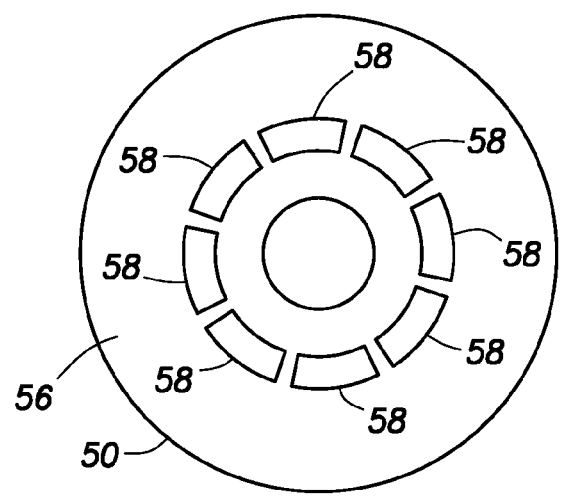
FIG. 2A shows an example arrangement of transducers in a sub.

The example transducers shown in FIG. 2 are only displayed on opposed sides of the collar 50 for purposes of clarity of the illustration, however. In some examples, a plurality of circumferentially segmented transducers 58, 46, 40 may be disposed around substantially the entire circumference of the associated surfaces described above within the chamber 56 and on the exterior of the collar 50. Referring to FIG. 2A, an example of a plurality of circumferentially segmented, longitudinal transducers 58 is shown disposed around substantially the entire circumference of the lower surface of the chamber 56. A similar, corresponding circumferential arrangement may be made for the second transducer (46 in FIG. 2) and the third transducer (40 in FIG. 2).

Figure 3:
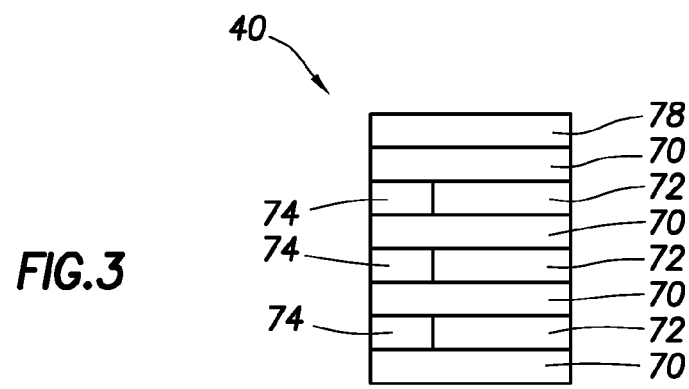
FIG. 3 shows one example of a piezoelectric transducer.

One example of a piezoelectric transducer is shown schematically in FIG. 3. The transducer 40 may include a plurality of planar piezoelectric ceramic elements or crystals 70 polarized in the direction of their thickness (transverse to the long dimensions of the plane of the elements). A composite rubber layer consisting of laterally adjacent hard rubber sheet 72 and soft rubber sheet 74 ("hard" and "soft" meaning relative to each other) may be disposed between successive piezoelectric elements 70. In one example, the thickness and hardness of the rubber sheets 72, 74 may be selected so that the transducer 40 has a selected resonant frequency. In some examples, the resonant frequency may be selected to substantially match the frequency of noise induced in the drill string (20 in FIG. 1) from the various sources described above with reference to FIG. 2. For example, for the third transducer (40 in FIG. 2), the resonant frequency may be selected to substantially match the frequency of lateral vibrations in the drill string (20 in FIG. 1) during drilling and any vibrations caused by flow of mud and drill cuttings in the annular space between the drill string and the wall of the wellbore. For the second transducer (46 in FIG. 2), the resonant frequency of the transducer may be selected to substantially match the noise induced by the flow of drilling fluid (30 in FIG. 1) through the collar (50 in FIG. 2). For the longitudinal transducer (58 in FIG. 2) the resonant frequency may be selected to substantially match the frequency of axial vibrations induced in the drill string (20 in FIG. 1) during drilling. A reactive mass (78 in FIG. 5) may be included on one end of the stack of crystals 70 and composite rubber sheets 72, 74 to increase the sensitivity of the transducer 40.

Figure 4:
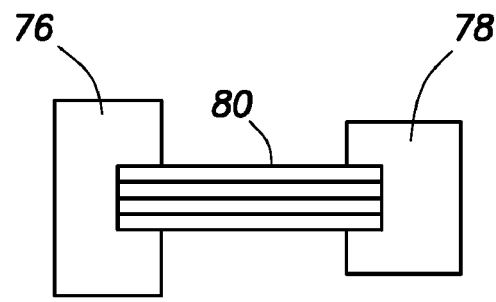
FIG. 4 shows another example of a piezoelectric transducer.
Figure 4A:
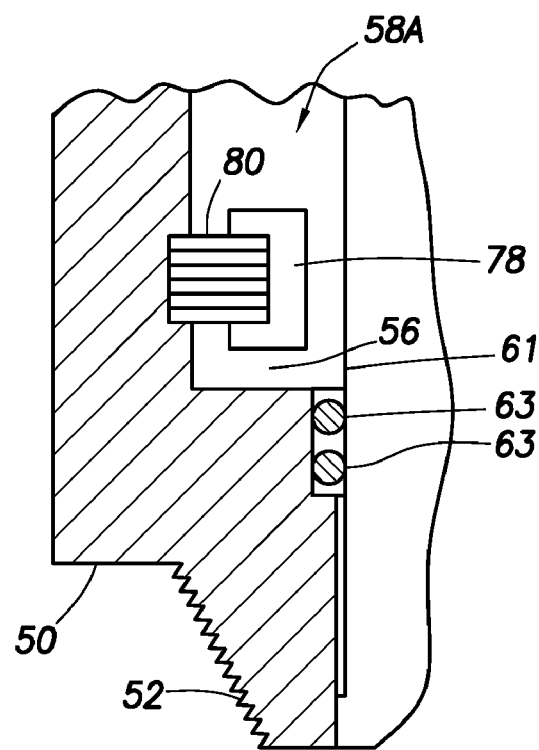
FIG. 4A shows a transducer according to FIG. 4 in one possible arrangement in a drill collar.

Another example of a piezoelectric transducer is shown in FIG. 4. The transducer in FIG. 4 operates by bending or flexing of a stack 80 of piezoelectric crystals. The stack 80 may be supported at one longitudinal end by a suitable structure 76, for example in the wall of the collar (50 in FIG. 2). The other end of the stack 80 may include a reactive mass 78 thereon to increase the sensitivity of the stack 80 to motion of the collar (50 in FIG. 2). The transducer shown in FIG. 4A may be particularly well suited for detecting axial vibrations induced in the generator sub (10 in FIG. 2) when mounted for such purpose. An example of the generator sub 10 including an axial vibration sensitive transducer 58A is shown in half cross section in FIG. 4A. FIG. 4A is a view of approximately the same portion of the collar 50 as shown in FIG. 2 where the longitudinal transducer (58 in FIG. 2) is mounted, however the transducer shown in FIG. 4A can be similar to the one shown in FIG. 4.

Figure 5:
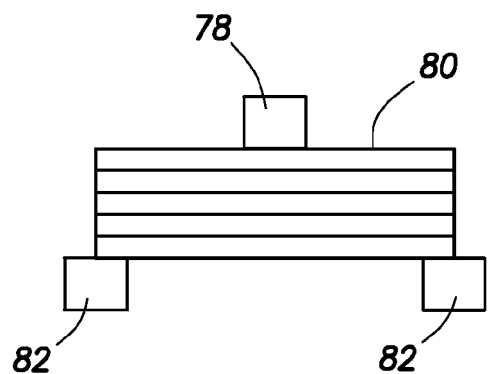
FIG. 5 shows another example of a piezoelectric transducer.

Another example of a flexure-type transducer is shown in FIG. 5, wherein the stack 80 is supported on suitable structures 82 at the longitudinal ends thereof. The stack 80 may include a reactive mass 78 in the longitudinal center to increase sensitivity of the transducer.

Figure 6:
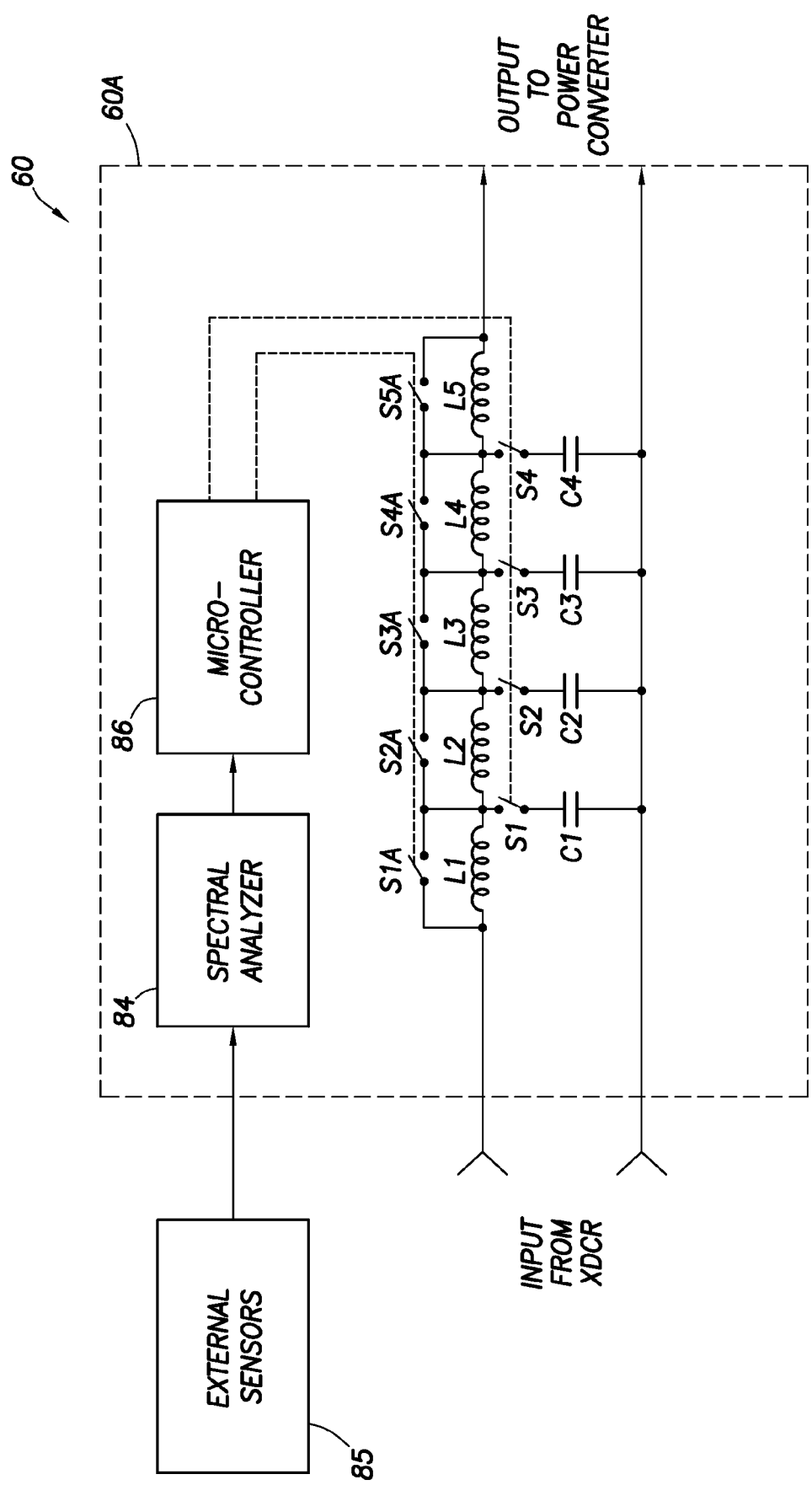
FIG. 6 shows an example tunable resonant circuit associated with a transducer.

As explained above with reference to FIGS. 3, 4 and 5, the various piezoelectric transducers may have resonant frequencies selected to match the frequency of various forms of acoustic energy present in the drill string. In another example, and referring to FIG. 6, any one or more of the transducers may be coupled to a tunable resonant circuit 60A, which may form part of the power conditioner 60. An example of such tunable resonant circuit may include a plurality of capacitors C1, C2, C3, C4 arranged electrically in parallel, and a plurality of inductors L1, L2, L3, L4, L5 arranged in electrical series. A switching element, S1, S2, S3, S4, such as a solid state relay or other switch, may be arranged to connect and disconnect each respective capacitor C1, C2, C3, C4 from the tunable resonant circuit. Corresponding switching elements S1A, S2A, S3A, S4A, S5A may perform similar function with respect to the inductors L1, L2, L3, L4. L5. The power conditioner 60 may include a spectral analyzer 84, such as one embodied in a microprocessor. In the present example, one or more external sensors 85 may be coupled to an input of the spectral analyzer 84. The one or more external sensors 85 may be hydrophones in pressure communication with the interior passage in the drill string, with the annular space inside the wellbore and/or accelerometers in contact with the collar (50 in FIG. 2). In one example the accelerometers are triaxial. The one or more external sensors 85 are preferably high sensitivity and have a broad frequency response. The output of the spectral analyzer 84 may be used to determine a frequency content of the acoustic energy present in the drill string (20 in FIG. 1). Output of the spectral analyzer 84 may be coupled to a microcontroller 86, which can operate the foregoing switching elements to include or exclude the various capacitors and inductors from the tunable resonant circuit 60A. In one example, a resonant frequency of the tunable resonant circuit 60A may be selected to match the frequency content of the acoustic energy in the drill string as determined by the spectral analyzer 84. By matching resonant frequency of the tunable circuit 60A to the frequency content of the acoustic energy in the drill string, the efficiency of electric power generation from acoustic energy in the drill string may be increased. It will be appreciated by those skilled in the art that the one or more transducers (e.g., 40, 46, 58 in FIG. 2) may also be coupled to the input of the spectral analyzer 84 in order to characterize the vibrations induced in the drill string. A possible advantage of using a separate sensor or array of such sensors for vibration characterization is that the transducers in some examples may have a selected resonant frequency. Such resonant frequency may impair the transducer sensitivity at frequencies off resonance. Thus, using a separate a wideband response sensor as shown in FIG. 6 may improve characterization of drill string vibrations.

Drilling and wellbore instrumentation including an electric generator as described herein may eliminate the need to batteries and/or rotating electric generating devices. Such drilling and wellbore instrumentation may be more reliable and less expensive to operate and maintain than instrumentation using batteries or rotating electric generators.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electric power generator, comprising:
 a conduit disposed in a wellbore penetrating subsurface formations; and
 at least one piezoelectric transducer in contact with the conduit, the piezoelectric transducer configured to undergo stress in response to vibration in the conduit, the transducer comprising a plurality of piezoelectric crystals stacked in a thickness direction and each polarized in the thickness direction, wherein the transducer comprises
 a composite rubber layer disposed between successive piezoelectric crystals wherein the composite rubber layer comprises soft rubber adjacent to hard rubber.

2. The generator of claim 1 wherein the transducer comprises a reactive mass disposed on at least one of a longitudinal end thereof, and a longitudinal center thereof.

3. The generator of claim 1 wherein the conduit comprises a drill string.

4. The generator of claim 3 further comprising a plurality of circumferentially segmented piezoelectric transducers arranged about substantially an entire circumference of a chamber defined inside a sub forming part of the drill string.

5. The generator of claim 4 comprising a resilient tube extending along an interior of the chamber.

6. The generator of claim 4 wherein the circumferentially segmented piezoelectric transducers are configured to respond to axial drill string vibration induced during drilling.

7. The generator of claim 4 wherein the circumferentially segmented piezoelectric transducers are configured to respond to vibration induced by movement of fluid in an interior passage in the drill string.

8. The generator of claim 4 wherein the circumferentially segmented piezoelectric transducers are configured to respond to vibration induced by at least one of lateral vibration of the drill string and movement of fluid in an annular space between the drill string and a wall of the wellbore.

9. The generator of claim 3 further comprising an electromagnetic coupling in an end of the sub, the coupling configured to transmit electrical power generated by the at least one transducer to an adjacent component of the drill string by electromagnetic induction.

10. The generator of claim 1 wherein the at least one piezoelectric transducer has a resonant frequency selected to substantially match an expected frequency of vibration in the conduit.

11. The generator of claim 1 further comprising a spectral analyzer functionally coupled to an output of a vibration sensor, and a tunable resonance circuit functionally coupled between the output of the transducer and an electrical load, the tunable resonance circuit adjustable to cause a resonant frequency thereof to substantially match a frequency in the output of the vibration sensor.

12. The generator of claim 1 wherein the piezoelectric transducer comprises lead zirconate titanate.

13. The generator of claim 1 wherein the piezoelectric transducer comprises single crystal lead magnesium niobate-lead titanate.

14. The generator of claim 1 wherein the piezoelectric transducer comprises single crystal lead zirconate niobate-lead titanate.

* * * * *